(12) United States Patent
Sato et al.

(10) Patent No.: US 9,054,784 B2
(45) Date of Patent: Jun. 9, 2015

(54) SIGNAL SWITCHING APPARATUS

(75) Inventors: Takeo Sato, Miyagi-ken (JP); Shuichi Takeda, Miyagi-ken (JP); Shinichi Inayama, Miyagi-ken (JP)

(73) Assignee: ALPS ELECTRIC CO., LTD., Tokyo (JP)

(*) Notice: Subject to any disclaimer, the term of this patent is extended or adjusted under 35 U.S.C. 154(b) by 605 days.

(21) Appl. No.: 13/444,194

(22) Filed: Apr. 11, 2012

(65) Prior Publication Data

US 2012/0314712 A1 Dec. 13, 2012

(30) Foreign Application Priority Data

Jun. 8, 2011 (JP) .................................. 2011-128175

(51) Int. Cl.
| | | |
|---|---|---|
| H04L 12/56 | (2006.01) | |
| H04B 1/48 | (2006.01) | |
| H03G 3/30 | (2006.01) | |
| H03G 1/00 | (2006.01) | |

(52) U.S. Cl.
CPC ............... *H04B 1/48* (2013.01); *H03G 3/3052* (2013.01); *H03G 1/0088* (2013.01)

(58) Field of Classification Search
None
See application file for complete search history.

(56) References Cited

U.S. PATENT DOCUMENTS

| | | | | |
|---|---|---|---|---|
| 6,950,410 | B1* | 9/2005 | Brandt ......................... | 370/276 |
| 2004/0087286 | A1* | 5/2004 | Inoue et al. ................... | 455/130 |
| 2004/0263372 | A1* | 12/2004 | Nonaka ........................ | 341/144 |
| 2004/0266378 | A1* | 12/2004 | Fukamachi et al. ........ | 455/188.1 |
| 2006/0141944 | A1* | 6/2006 | Shibagaki et al. .............. | 455/78 |

FOREIGN PATENT DOCUMENTS

| | | |
|---|---|---|
| JP | 08-149038 | 6/1996 |
| JP | 4618461 | 11/2010 |

* cited by examiner

*Primary Examiner* — Hassan Phillips
*Assistant Examiner* — Saba Tsegaye
(74) *Attorney, Agent, or Firm* — Brinks Gilson & Lione (57) ABSTRACT

A signal switching apparatus includes a switch circuit having a common terminal and first to third terminals, and enabling two terminals among the first to third terminals to be simultaneously connected to the common terminal while enabling the first to third terminals to be individually attachable/detachable to/from the common terminal, and an amplification circuit of which an input terminal is connected to the first terminal, and an output terminal is connected to the second terminal. Here, gain in the output terminal being an output point, with respect to a signal level in the common terminal being an input point, is switched to a first gain when only the first terminal is connected to the common terminal, a second gain when only the second terminal is connected to the common terminal, and a third gain when the first and second terminals are simultaneously connected to the common terminal.

4 Claims, 9 Drawing Sheets

SIGNAL SWITCHING APPARATUS

CLAIM OF PRIORITY

This application claims benefit of Japanese Patent Application No. 2011-128175 filed on Jun. 8, 2011, which is hereby incorporated by reference in its entirety.

BACKGROUND OF THE DISCLOSURE

1. Field of the Disclosure

The present disclosure relates to a signal switching apparatus, and particularly, to a signal switching apparatus, which can be applied to a transmission/reception unit of a wireless LAN communication apparatus.

2. Description of the Related Art

In the related art, a wireless LAN communication apparatus includes a reception circuit that amplifies a reception wireless LAN signal received by an antenna apparatus, using an LNA (Low Noise Amplifier) to obtain the amplified signal, a transmission circuit that generates a transmission wireless LAN signal transmitted from the antenna apparatus, and a signal switching device that switches the reception wireless LAN signal to/from the transmission wireless LAN signal which is input and output with respect to the antenna apparatus. As for a reception circuit having the LNA, when the received wireless LAN signal is a strong input, the wireless LAN signal amplified in the LNA becomes distorted, so that packet errors tend to increase. In order to suppress the increase in distortion of the signal when the received signal is a strong input, a high-frequency circuit including an LNA having a bypass circuit has been suggested (For example, see WO. 2007129716).

In a high-frequency circuit, when the received wireless LAN signal is a weak input, the wireless LAN signal amplified using the LNA is input to the reception circuit, and when the received wireless LAN signal is a strong input, the wireless LAN signal is input to the reception circuit by the bypass circuit without using the LNA. Thus, when the wireless LAN signal is the weak input, the quality of the wireless LAN signal may be improved, and when the wireless LAN signal is the strong input, distortion caused by the amplification of the wireless LAN signal may be suppressed, so that it is possible to avoid an increase in the packet error.

However, the LNA having the bypass circuit is relatively expensive in comparison with a typical LNA, resulting in an increase in the overall cost of the high-frequency circuit. In addition, even when the LNA having the bypass circuit is used, gain of the reception signal caused by switching of the bypass circuit is greatly changed in a case in which the reception signal is changed from a weak input to a strong input, so that there is a problem in smoothly coping with a change in signal intensity.

SUMMARY

There is provided a signal switching apparatus, including: a switch circuit configured to have a common terminal and first to third terminals, and to enable two terminals among the first to third terminals to be simultaneously connected to the common terminal while enabling the first to third terminals to be individually attachable and detachable to and from the common terminal; and an amplification circuit of which an input terminal is connected to the first terminal, and an output terminal is connected to the second terminal, wherein gain in the output terminal of the amplification circuit being an output point, with respect to a signal level in the common terminal being an input point, is switched to a first gain when only the first terminal is connected to the common terminal, a second gain when only the second terminal is connected to the common terminal, and a third gain when the first terminal and the second terminal are simultaneously connected to the common terminal.

DESCRIPTION OF THE EXEMPLARY EMBODIMENTS

Hereinafter, exemplary embodiments of the invention will now be described in detail with reference to the accompanying drawings.

First Embodiment

A first embodiment of the present invention is an example of a signal switching apparatus, which is applied to a transmission/reception unit of a wireless LAN communication apparatus to switch a transmission signal and a reception signal.

Figure 1:
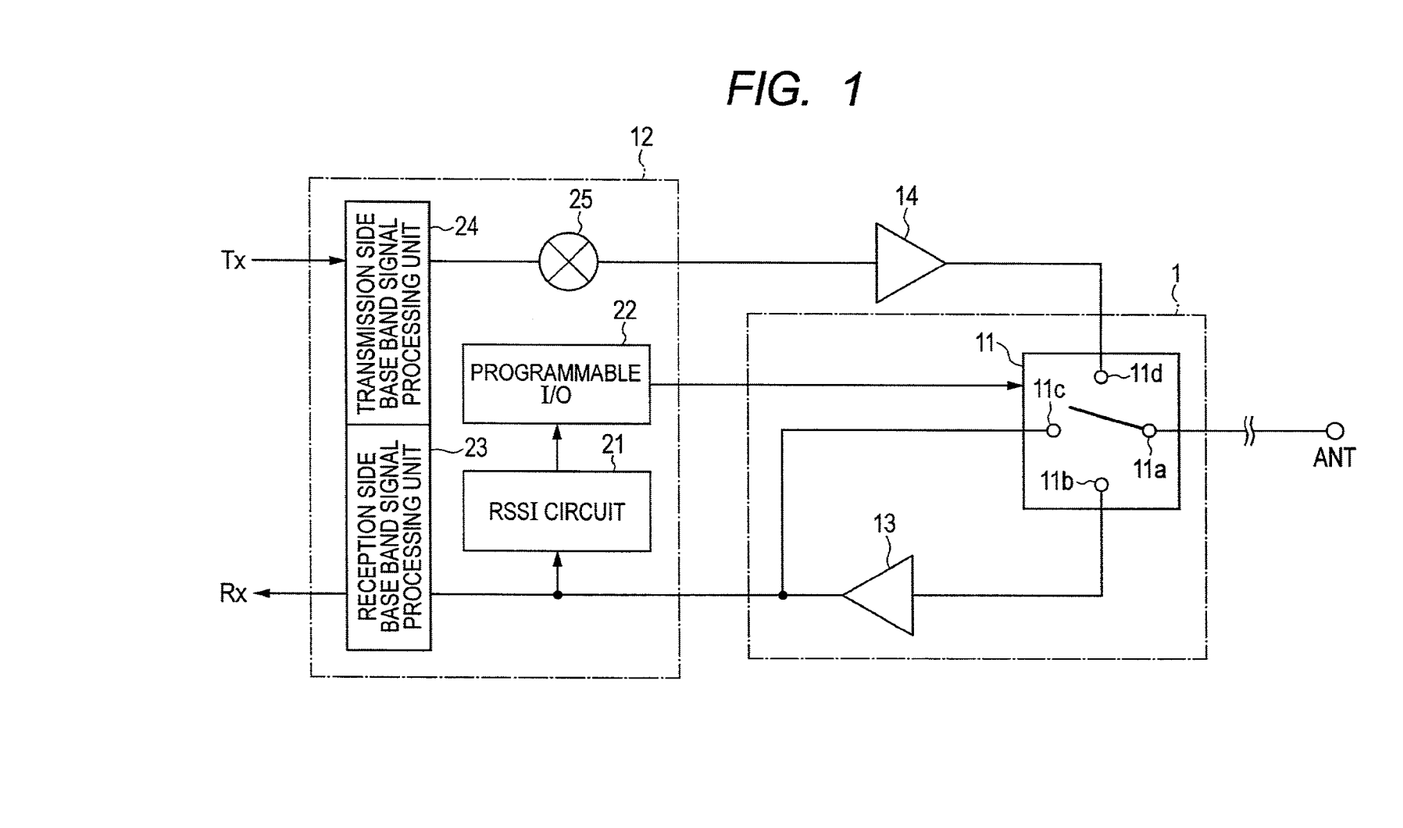
FIG. 1 is a configuration diagram of a signal switching apparatus according to a first embodiment of the present invention.

FIG. 1 is a configuration diagram of a signal switching apparatus 1 according to a first embodiment of the present invention. As illustrated in FIG. 1, the signal switching apparatus 1 according to the present embodiment includes a switch circuit 11 that is connected to a power feeding unit of a transmission/reception antenna apparatus, and an LNA 13 (Low Noise Amplifier) as an amplification circuit that is connected to an input terminal of a reception system between the signal switching apparatus 1 and a wireless LAN IC 12 that acts as a transmission circuit and a reception circuit while acting as a control unit for controlling the switch circuit 11. A power amplifier 14 is connected to an output terminal of a transmission system between the wireless LAN IC 12 and the signal transmission apparatus 1.

The switch circuit 11 includes a common terminal 11a and first to third terminals 11b to 11d, and is a three-port switch which is configured to be simultaneously connected to two terminals among the first to third terminals 11b to 11d while being individually attachable and detachable to and from the common terminal 11a.

Specifically, the switch circuit 11 includes the common terminal 11a connected to an antenna terminal, and the first to third terminals 11b to 11d configured to switch on/off between the first to third terminals 11b to 11d and the common terminal 11a. The input terminal of the LNA 13 is connected to the first terminal 11b. A reception system of the wireless LAN IC 12 is connected to the second terminal 11c while an output terminal of the LNA 13 is connected to the second terminal 11c. An output terminal of the power amplifier 14 of the transmission system is connected to the third terminal 11d. A transmission system of the wireless LAN IC 12 is connected to an input terminal of the power amplifier 14.

In the present embodiment, the wireless LAN IC 12 switches gain in the output terminal of the LNA 13 that is an output point with respect to the common terminal 11a that is an input point, by switching a connection state between the common terminal 11a and the first to third terminals 11b to 11d in accordance with a signal level of a reception signal input from an antenna terminal ATT. The wireless LAN IC 12 may switch a corresponding connection state to a first connection state in which only the first terminal 11b is connected to the common terminal 11a in a case of a weak input in which a signal level of a signal (hereinafter, simply referred to as a reception signal) corresponding to an RSSI (Receive Signal Strength Indicator) is lower than a first threshold value. In addition, the wireless LAN IC 12 may switch the corresponding connection state to a second connection state in which the first terminal 11b and the second terminal 11c are simultaneously connected to the common terminal 11a in a case of an intermediate input in which the reception signal level is between the first threshold value and a second threshold value. In addition, the wireless LAN IC 12 may switch the corresponding connection state to a third connection state in which only the second terminal 11c is connected to the common terminal 11a in a case in which the reception signal level exceeds the second threshold value. In addition, the wireless LAN IC 12 may switch the corresponding connection state to the second connection state in which the first terminal 11b and the second terminal 11c are simultaneously connected to the common terminal 11a when the reception signal level exceeds the first threshold value, and then may switch the corresponding connection state to the third connection state in which the second terminal 11c is connected to the common terminal 11a.

The input terminal of the LNA 13 is connected to the first terminal 11b, and the output terminal thereof is connected to the second terminal 11c. The LNA 13 is configured to amplify a high-frequency signal of a specific band (for example, 2.4 GHz band) to a predetermined gain (for example, 15 dBm) so that a reception signal output from the first terminal 11b of the switch circuit 11 is amplified to thereby output the amplified signal to the wireless LAN IC 12. In the present embodiment, since the reception signal is input to only the first terminal 11b in the first connection state, all the reception signals are input to the LNA 13 to thereby be amplified. Gain at this time is referred to as a first gain. In addition, since, in the third connection state, the reception signal is input to only the second terminal 11c, and the input signal is output to the wireless LAN IC 12 while bypassing the LNA 13, the reception signal is not amplified. Gain at this time is referred to as a second gain. In addition, since, in the second connection state, the reception signal is branched and input in parallel to the first terminal 11b and the second terminal 11c, a part of the reception signal output from the first terminal 11b is amplified in the LNA 13; however, a part of the reception signal branched into the second terminal 11c is not amplified, and synthesized in the output terminal of the LNA 13, so that a loss due to mismatch occurs. Gain of the reception signal of which the signal level is lowered by the mismatch loss is a third gain which is smaller than the first gain in the first connection state, and larger than the second gain in the third connection state.

The wireless LAN IC 12 includes an RSSI circuit 21 detects an RSSI, a programmable I/O 22, a reception side baseband signal processing unit 23 constituting the reception circuit, a transmission side baseband signal processing unit 24 constituting the transmission circuit, and a mixer 25.

The RSSI circuit 21 measures an RSSI of the reception signal that is input from the antenna terminal ATT to thereby detect a signal level. In addition, the RSSI circuit 21 outputs signal level information of the reception signal to the programmable I/O 22.

The programmable I/O 22 includes a plurality of I/O ports to which an arbitrary function is assigned in accordance with the reception signal level. The programmable I/O 22 outputs a switching control signal to the switch circuit 11 through each of the plurality of I/O ports in accordance with the reception signal level. In the present embodiment, the programmable I/O 22 outputs a switching control signal capable of switching to the first connection state in a region (for example, −70 dBm or smaller) of the weak input in which the reception signal level is smaller than the first threshold value, and outputs a switching control signal capable of switching to the third connection state in a region (for example, −20 dBm or larger) of a strong input in which the reception signal level is larger than the second threshold value. In addition, the programmable I/O 22 outputs a switching control signal capable of switching to the second connection state in a region of the intermediate input in which the reception signal level is between the first threshold value and the second threshold value.

The reception side baseband signal processing unit 23 includes a reception filter, a D/A converter, a demodulation decoding circuit, and the like, and performs data demodulation of reception data. The transmission side baseband signal processing unit 24 includes a transmission filter, an A/D converter, a modulation circuit, and the like, and transmits transmission data that has been encoded and framed, as an RF transmission signal. The mixer circuit 25 frequency-converts, into a signal of a specific frequency (for example, 2.4 GHz band), the RF transmission signal that is output from the transmission side baseband signal processing unit 24 to thereby output the frequency-converted signal, to the power amplifier 14. The power amplifier 14 amplifies the transmission signal to thereby output the amplified signal to the switch circuit 11.

Next, operations of the signal switching apparatus 1 configured as above will be described.

Figure 2A:
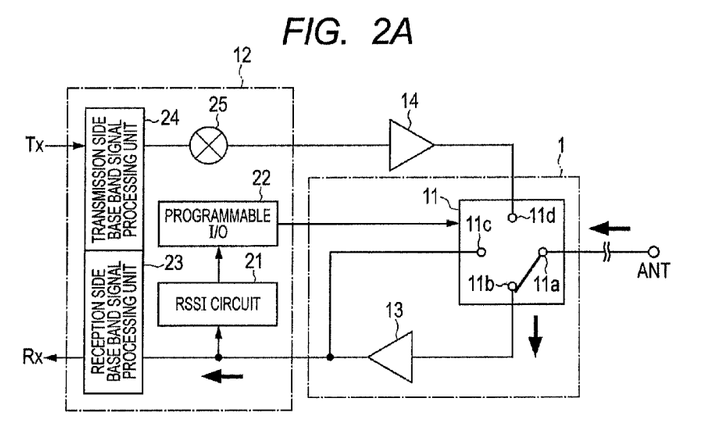
FIGS. 2A to 2C are diagrams illustrating switching states of a switch circuit of the signal switching apparatus according to the first embodiment of the present invention.

In FIG. 2 illustrates a switching state of the switch circuit of the signal switching apparatus 1 when a reception signal is a weak input (for example, −70 dBm). The RSSI circuit 21 outputs, to the programmable I/O 22, a port switching signal in accordance with a signal level of a reception signal received in the antenna terminal ATT. The programmable I/O 22 outputs, to the switch circuit 11, the switching control signal toward the first connection state in accordance with the port switching signal. The switch circuit 11 connects the common terminal 11a and the first terminal 11b in accordance with the switching control signal.

The reception signal input to the switch circuit 11 from the antenna terminal ATT is output to the LNA 13 through the first terminal 11b, and the output reception signal is amplified in the LNA 13 (for example, to −55 dBm). The amplified reception signal is output to the reception side baseband signal processing unit 23 of the wireless LAN IC 12. In the reception side baseband signal processing unit 23, data demodulation of reception data of the reception signal is executed.

Figure 2B:
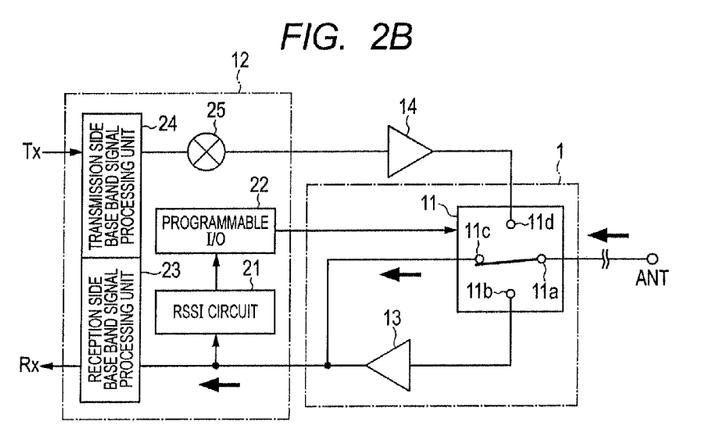

In FIG. 2B illustrates, a switching state of the switch circuit of the signal switching apparatus 1 when the reception signal is a strong input (for example, −20 dBm). The RSSI circuit 21 outputs, to the programmable I/O 22, the port switching signal in accordance with the reception signal level received from the antenna terminal ATT. The programmable I/O 22 outputs, to the switch circuit 11, a switching control signal toward the third connection state in accordance with the port switching signal. The switch circuit 11 connects the common terminal 11a and the second terminal 11c in accordance with the switching control signal.

The reception signal input to the switch circuit 11 from the antenna terminal ATT is output from the second terminal 11c to a reception system of the reception side baseband signal processing unit 23 that is an output terminal of the LNA 13, without using the LNA 13. In the reception side baseband signal processing unit 23, data demodulation of reception data of the reception signal is executed.

Figure 2C:
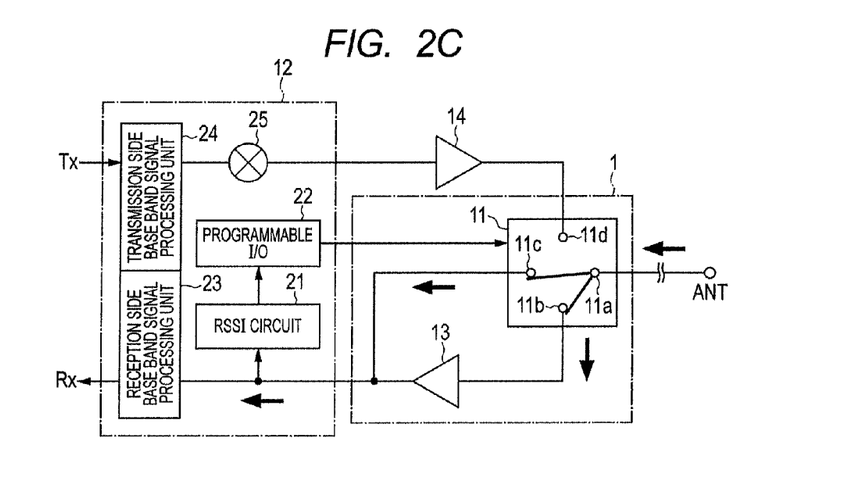

In FIG. 2C illustrates, a switching state of the switch circuit of the signal switching apparatus 1 when the reception signal is an intermediate input (for example, −40 dBm). The RSSI circuit 21 outputs, to the programmable I/O 22, the port switching signal in accordance with the reception signal level received in the antenna terminal ATT. The programmable I/O 22 outputs, to the switch circuit 11, the switching control signal toward the second connection state in accordance with the port switching signal. The switch circuit 11 connects the common terminal 11a and the first and second terminals 11b and 11c in common in accordance with the switching control signal.

As for the reception signal from the antenna terminal input to the switch circuit 11, a part of the reception signal bypasses the LNA 13 through the second terminal 11c, and at the same time, a part of the reception signal is input to the LNA 13 through the first terminal 11b to thereby be amplified.

Here, in the second connection state, the part of the reception signal (for example, −25 dBm) that is amplified through the LNA 13 and the part of the reception signal (for example, −40 dBm) that is output from the second terminal 11c through the LNA 13 are synthesized, so that mismatch occurs resulting in gain loss. Due to the gain loss, the reception signal level after the synthesis in the output terminal of the LNA 13 is reduced (for example, −30 dBm). That is, gain that is smaller than gain of the first connection state and larger than gain of the third connection state is provided. The reception signal amplified at the provided gain is input to the wireless LAN IC 12. In the reception side baseband signal processing unit 23, data demodulation of the reception data of the reception signal is executed.

Figure 3:
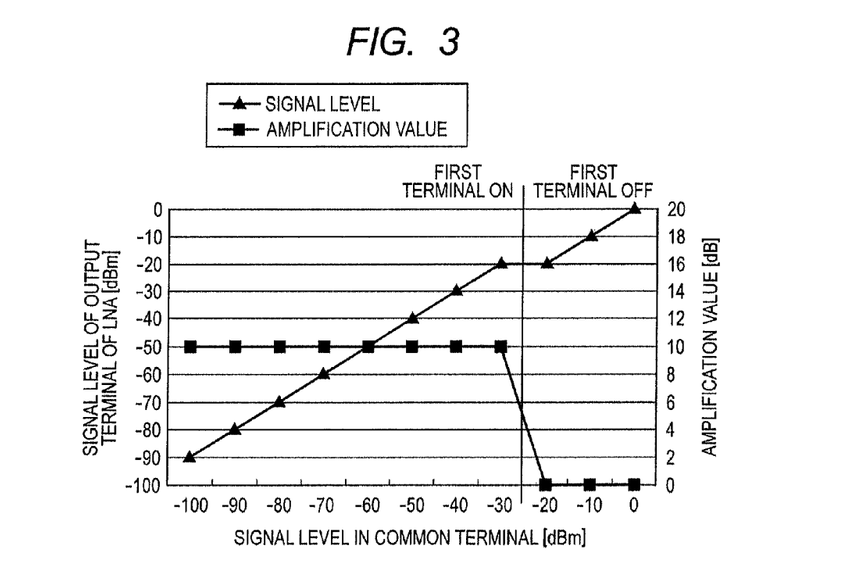
FIG. 3 is a diagram illustrating a simulation result of a signal level in an output terminal of an LNA (Low Noise Amplifier)
Figure 4A:
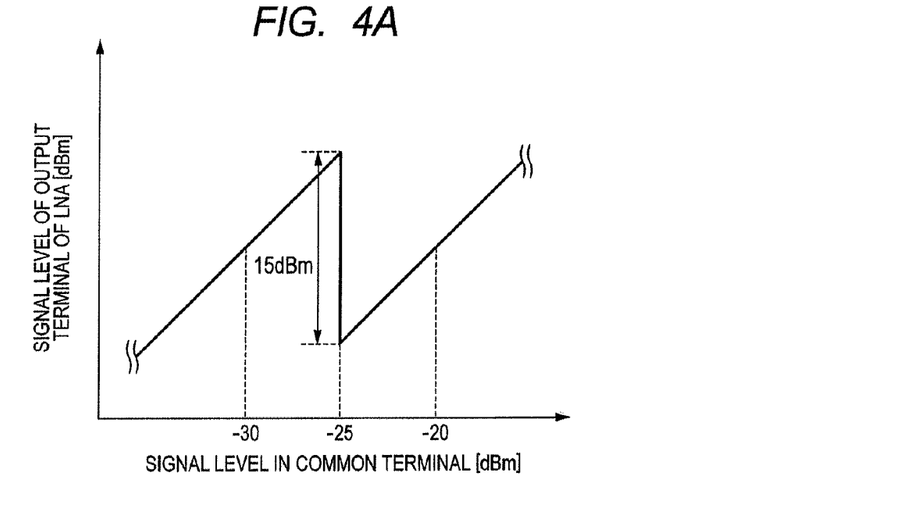
FIGS. 4A and 4B are diagrams illustrating simulation results of a signal level in an output terminal of an LNA.

Here, in FIGS. 3 and 4A, simulation results of the signal level in the output terminal of the LNA 13 in a case of being switched directly to the third connection state from the first connection state without passing through the second connection state are illustrated. It is assumed that the signal level of the common terminal 11a linearly rises from −100 dBm to 0 dBm. In addition, the first connection state is maintained when the signal level is in a range of from −100 dBm to −25 dBm, and the first connection state is directly switched to the second connection state at the point of time when the signal level exceeds −25 dBm. Gain of the LNA 13 is 10 dB.

As shown in FIG. 3, in the first connection state in which only the first terminal 11b is connected to the common terminal 11a of the switch circuit 11, an input signal is amplified at 10 dB to be output.

At the point when the signal level exceeds −25 dB, the connection state is directly switched to the second connection state in which only the second terminal 11c is connected to the common terminal 11a of the switch circuit 11; however, the LNA 13 is completely bypassed in the second connection state, so that amplification of 10 dB due to the LNA 13 is lost, and the signal level in the output terminal of the LNA 13 is dropped to a level of the input signal of the common terminal 11a (for example, −25 dBm). That is, gain in the output terminal of the LNA 13 that is an output point with respect to the signal level of the common terminal 11a that is an input point is directly switched from gain in the first connection state to gain at the second connection state.

Figure 4B:
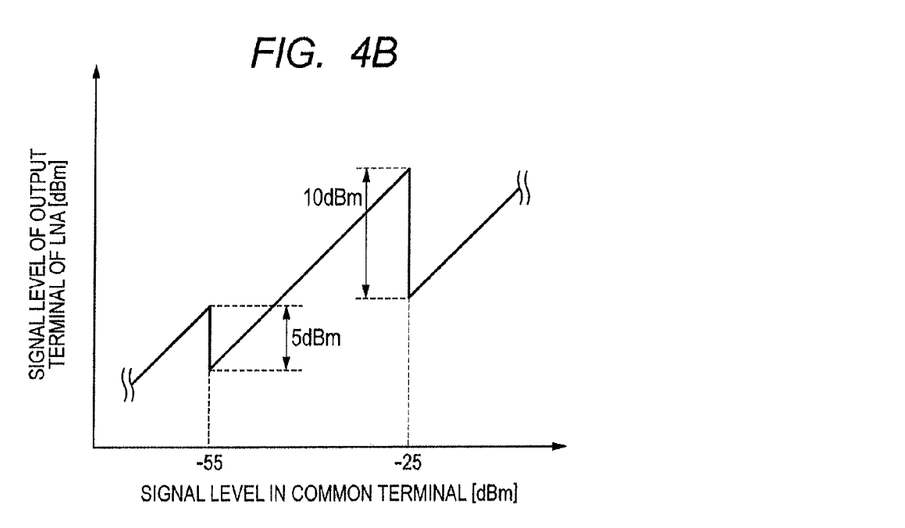

FIG. 4B illustrates a simulation result of a signal level in the output terminal of the LNA 13 when the first connection state is switched to the third connection state while passing through the second connection state. As illustrated in FIG. 4B, in the first connection state, the signal level is amplified at a gain of 10 dB with respect to the signal level in the common terminal 11a, by the LNA 13. Next, at the point of when the reception signal level exceeds the second threshold value (−55 dBm), the connection state is switched to the second connection state. In the second connection state, since the first terminal 11b and the second terminal 11c are simultaneously connected to the common terminal 11a, so that a part of the reception signal is input to the LNA 13 to thereby be amplified at the gain of 10 dB, and the reception signal input to the second terminal 11c is applied to the output terminal of the LNA 13 without being amplified, so that a matching loss occurs by synthesis of reception signals of two systems having different gains, thereby reducing the signal level (for example, a reduction of 5 dB). Due to this, in the vicinity of the second threshold, the signal level is reduced by only 5 dB in accordance with switching from the first connection state to the second connection state. The gain in the second connection state may be gain having only a smaller matching loss than that of the gain (10 dB) in the second connection state.

In addition, when the reception signal level is increased to exceed the first threshold value (−25 dBm), a corresponding connection state is switched to the third connection state. In the third connection state, since only the second terminal 11c is connected to the common terminal 11a, and the reception signal is input to the wireless LAN IC 12 while bypassing the LNA 13, a level of an input signal of the wireless LAN IC 12 becomes the same as the reception signal level. Due to this, in the vicinity of the first threshold value, the gain in the second connection state is changed to gain (0 dB) in the third connection state, and the signal level is changed by, for example, 10 dB in accordance with the change in the gain.

In this manner, in the signal switching apparatus 1 according to the present embodiment, by switching the first connection state to the third connection state while passing through the second connection state, the second connection state that is an intermediate gain is passed in a process of switching the first connection state to the third connection state (only bypass) in accordance with an RSSI, so that variation of the signal level of an output signal may be reduced even when the reception signal is changed from a weak input to a strong input, thereby flexibly adjusting gain of the output signal.

As described above, in the signal switching apparatus 1 according to the first embodiment of the present invention, the switch circuit 11 having the common terminal 11a and the first to third terminals 11b to 11d is provided in the switch circuit that switches a reception signal to/from a transmission signal to thereby configure a path of bypassing the LNA 13 using the second terminal 11*c*, so that it is not necessary that a bypass circuit is provided in the LNA 13, thereby achieving cost reduction. In addition, an intermediate gain is realized in the second connection state in which the first terminal 11*b* and the second terminal 11*c* are simultaneously connected to the common terminal 11*a*, thereby suppressing a signal level of a signal input to the wireless LAN IC 12 from being changed even when the reception signal level is changed from the weak input to the strong input.

Second Embodiment

Next, a signal switching apparatus 2 according to a second embodiment of the present invention will be described. In addition, in the following description, the same components as those of the signal switching apparatus 1 according to the first embodiment of the present invention are denoted by the same reference numerals, and repeated descriptions will be omitted. The second embodiment of the present invention is an example of a signal switching apparatus that is applied to a transmission/reception unit of the wireless LAN communication apparatus to thereby switch a transmission signal to/from a reception signal.

Figure 5:
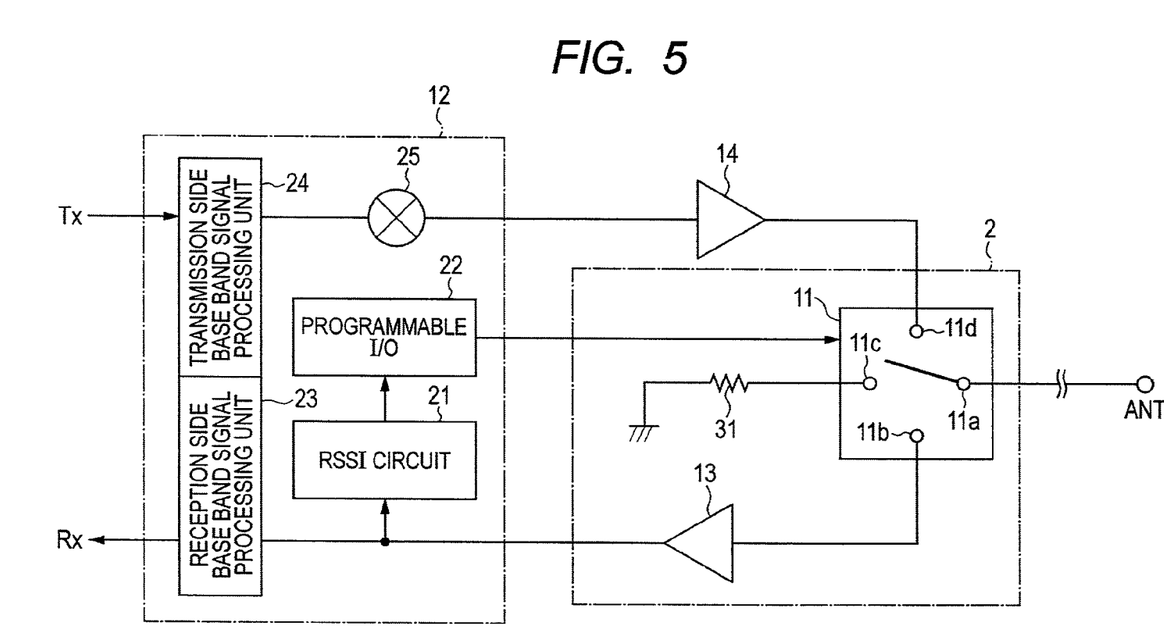
FIG. 5 is a configuration diagram of a signal switching apparatus according to a second embodiment of the present invention.

FIG. 5 is a configuration diagram of a signal switching apparatus 2 according to a second embodiment of the present invention. In the signal switching apparatus 2 according to the present embodiment, the second terminal 11*c* of the switch circuit 11 is grounded to the ground through a resistance element 31 acting as an attenuation circuit. As for the resistance element 31, an end thereof is connected to the second terminal 11*c*, and the other end thereof is connected to the ground.

The switch circuit 11 switches the corresponding connection state to the first connection state in which the common terminal 11*a* is connected to the first terminal 11*b* when the reception signal level is smaller than or equal to a predetermined first threshold value. In addition, the switch circuit 11 switches the corresponding connection state to the second connection state in which the common terminal 11*a* is connected to the first terminal 11*b* and the second terminal 11*c* in common when the reception signal level is larger than the predetermined first threshold value.

The resistance element 31 acts as a termination resistor when the corresponding connection state is switched to the second connection state by the switch circuit 11. In the present embodiment, in a case of a strong input in which the reception signal level larger than or equal to a predetermined threshold value, the corresponding connection state is switched to the second connection state, so that the resistance element 31 acts as the attenuation circuit that attenuates the reception signal level, thereby reducing distortion of the reception signal. In addition, attenuation of the reception signal level may be appropriately changed by adjusting a resistance value of the resistance element 31.

In the present embodiment, the wireless LAN IC 12 switches a connection state between the common terminal 11*a* and the first to third terminals 11*b* to 11*d* in accordance with the reception signal level input from the antenna terminal ATT. The wireless LAN IC 12 switches the corresponding connection state to the first connection state in which only the first terminal 11*b* is connected to the common terminal 11*a* (see, FIG. 6A) in a case of a weak input in which the reception signal level is smaller than the first threshold value, and switches the corresponding connection state to the second connection state in which the first terminal 11*b* and the second terminal 11*c* are simultaneously connected to the common terminal (see, FIG. 6B) in a case of a strong input in which the reception signal level exceeds the first threshold value.

Figure 6A:
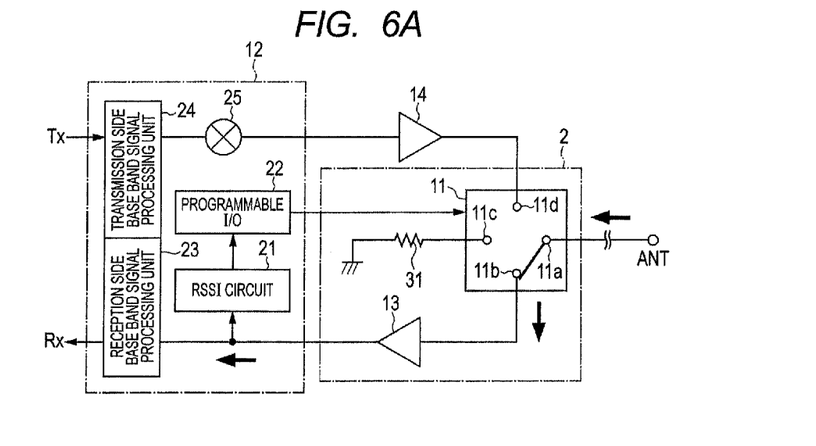
FIGS. 6A and 6B are diagrams illustrating switching states of a switch circuit of the signal switching apparatus according to the second embodiment of the present invention.
Figure 6B:
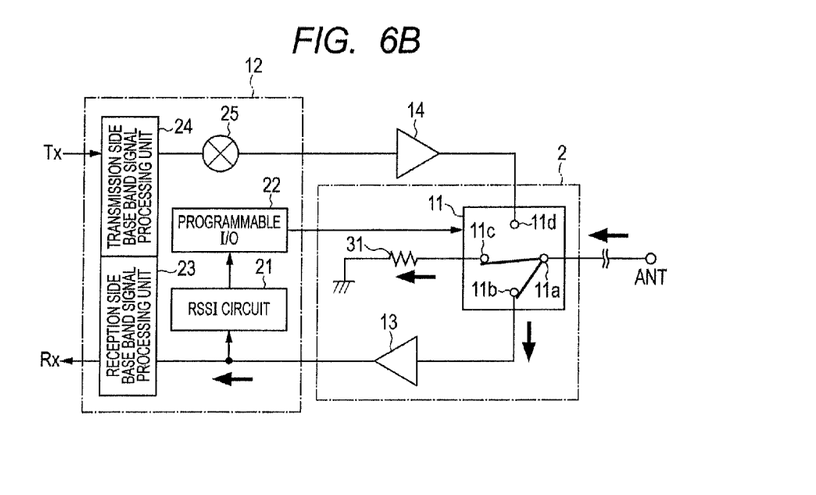

In the first connection state according to the present embodiment, since the reception signal is input to only the first terminal 11*b*, all the reception signals are input to the LNA 13 to be amplified. In addition, in the second connection state, a circuit configuration in which the resistance element 31 is connected to between the input terminal of the LNA 13 and the ground is obtained, so that the reception signal level is attenuated by the resistance element 31. In this manner, the wireless LAN IC 12 switches gain in the first connection state in which only the first terminal 11*b* is connected to the common terminal 11*a* to/from gain in the second connection state in which the first terminal 11*b* and the second terminal 11*c* are simultaneously connected to the common terminal 11*a*, in accordance with the reception signal level, thereby suppressing the distortion generated by the LNA 13.

Figure 7:
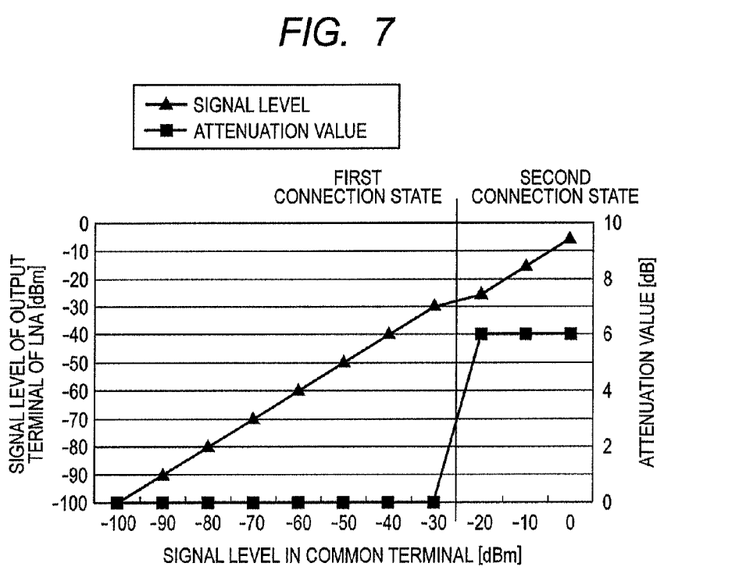
FIG. 7 is a diagram illustrating a change in attenuation of the signal switching apparatus according to the second embodiment of the present invention.

FIG. 7 is a diagram illustrating a change in attenuation in the first connection state and the second connection state. In addition, in FIG. 7, a signal level of a reception signal in the common terminal 11*a* is illustrated in a horizontal axis, and a signal level (left vertical axis) and attenuation (right vertical axis) in an output terminal of the LNA 13 are illustrated in a vertical axis.

As illustrated in FIG. 7, in the first connection state in which the reception signal is a weak input, the resistance element 31 is disconnected from a reception system, so that a signal amplified in the LNA 13 by 10 dB is output. Meanwhile, in the second connection state in which the reception signal exceeds the predetermined threshold value (for example, −25 dBm), since the first and second terminals 11*b* and 11*c* are simultaneously connected to the common terminal 11*a*, the signal is attenuated (for example, 6 dB) by receiving an attenuation influence from the resistance element 31, so that gain of the reception signal in the second connection state becomes smaller than gain in the first connection state.

As described above, the signal switching apparatus 2 according to the second embodiment of the present invention includes the switch circuit 11 having the common terminal 11*a* and the first to third terminals 11*b* to 11*d*, and the second terminal 11*c* of the switch circuit 11 is grounded through the resistance element 31, so that it is possible to attenuate the reception signal level in the second connection state. Due to this, it is possible to flexibly switch gain of the reception signal in a simple circuit configuration by switching the first connection state to/from the second connection state in accordance with the signal intensity of the reception signal.

Further, in the signal switching apparatus 2 according to the second embodiment of the present invention, a configuration in which the gain of the reception signal input from the antenna terminal is switched has been described; however, it is possible to switch the gain of a transmission signal transmitted from the transmission side baseband signal processing unit 24 of the wireless LAN IC 12.

Figure 8A:
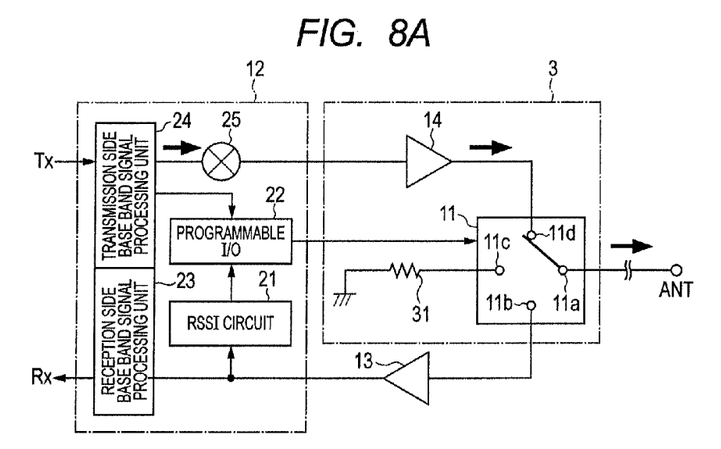
FIGS. 8A and 8B are diagrams illustrating switching states of a switch circuit of the signal switching apparatus according to the second embodiment of the present invention.
Figure 8B:
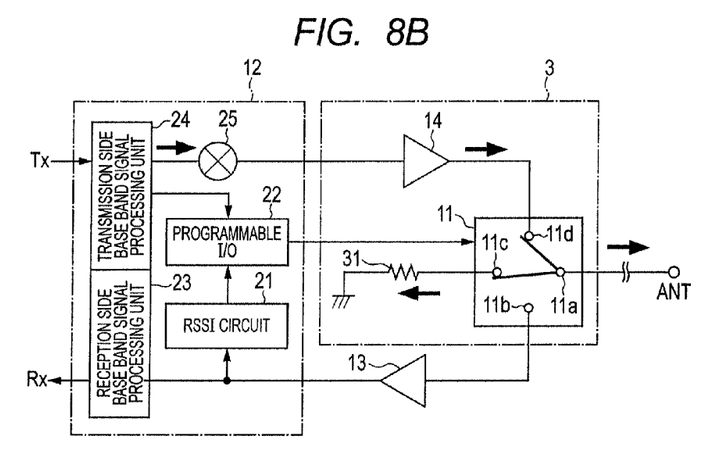

In FIGS. 8A and 8B, an example of the signal switching apparatus in which the gain of a transmission signal is switched is illustrated. A signal switching apparatus 3 illustrated in FIGS. 8A and 8B includes the switch circuit 11 and the power amplifier 14 as an amplification circuit of which an output terminal is connected to the third terminal 11*d*. When the gain of the transmission signal is switched, the wireless LAN IC 12 may switch gain in the common terminal 11*a* that is an output point of the transmission signal with respect to the signal level in an input terminal of the power amplifier 14 that is an input point of the transmission signal in accordance with the signal level of the transmission signal in the input terminal of the power amplifier 14 by switching the connection state between the common terminal 11a and the first terminal 11b to the third terminal 11d. The wireless LAN IC 12 switches a corresponding connection state to the first connection state in which only the third terminal 11d is connected to the common terminal 11a (see, FIG. 8A) when the signal level of the transmission signal at the input point of the power amplifier 14 is smaller than a predetermined threshold value. In addition, the wireless LAN IC 12 switches the corresponding connection state to the second connection state (see, FIG. 8B) in which the second terminal 11c and the third terminal 11d are simultaneously connected to the common terminal 11a when the signal level of the transmission signal is larger than a predetermined threshold value.

In the first connection state according to the present embodiment, the resistance element 31 is not connected to the output terminal of the power amplifier 14, so that the transmission signal is output without being attenuated. In addition, in the second connection state, the resistance element 31 is connected to the output terminal of the power amplifier 14, so that the transmission signal is attenuated in the resistance element 31 to thereby be output.

Figure 9:
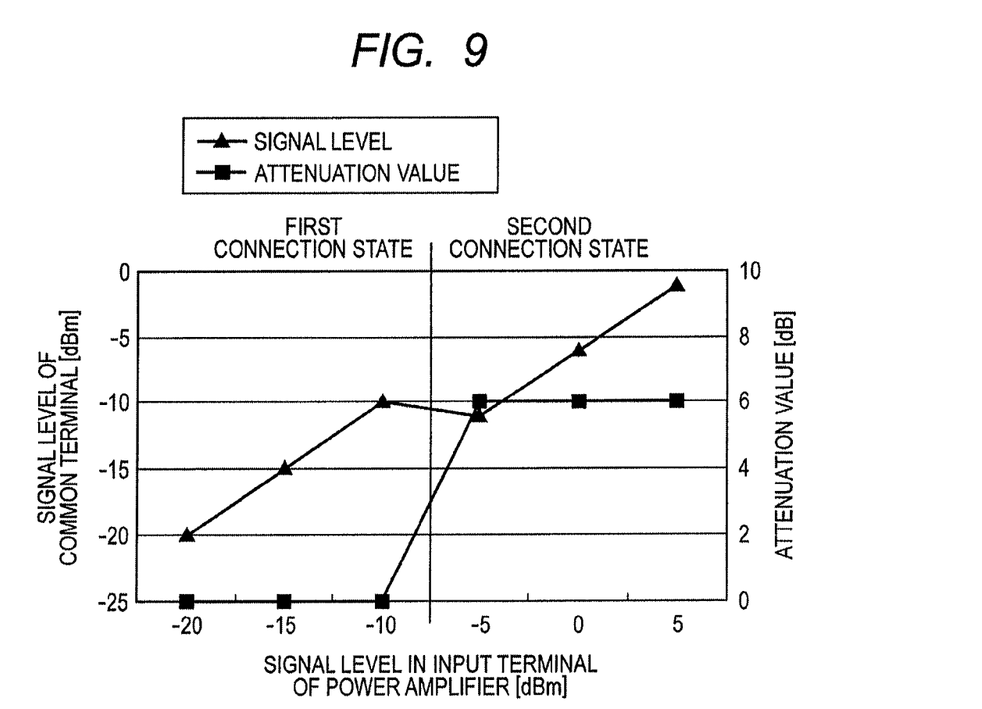
FIG. 9 is a diagram illustrating a change in attenuation of the signal switching apparatus according to the second embodiment of the present invention.

FIG. 9 is a diagram illustrating a change in attenuation in the first connection state and the second connection state. In FIG. 9, the signal level of the transmission signal in the input terminal of the power amplifier 14 is illustrated in a horizontal axis, and the signal level (left vertical axis) and the attenuation (right vertical axis) in the common terminal 11a are illustrated in a vertical axis. As illustrated in FIG. 9, in the first connection state in which the transmission signal is a weak input, the resistance element 31 is disconnected from a transmission system, so that a signal that is amplified by 10 dB in the power amplifier 14 is output. Meanwhile, in the second connection state in which the transmission signal exceeds a predetermined threshold value (for example, −25 dBm) to thereby be a strong input, since the second terminal 11c and the third terminal 11d are simultaneously connected to the common terminal 11a, the signal level of the transmission signal is attenuated (for example, 6 dB) by receiving an attenuation action by the resistance element 31, so that gain of the transmission signal in the second connection state becomes smaller than gain of the transmission signal in the first connection state.

In this manner, in the signal switching apparatus 3 according to the second embodiment of the invention, the resistance element 31 as an attenuation circuit that attenuates the transmission signal using the second terminal 11c is provided, so that it is possible to attenuate the transmission signal without separately providing the attenuation circuit, thereby achieving cost reduction.

Further, the invention is not limited to the above described embodiments, and may be diversely modified to be carried out. In the above described embodiments, a circuit configuration illustrated in the accompanying drawings is not limited to this, and may be appropriately changed within a range of demonstrating the effect of the invention. Other than these, the invention may be appropriately changed to be carried out without departing from the scope of the invention.

It should be understood by those skilled in the art that various modifications, combinations, sub-combinations and alterations may occur depending on design requirements and other factors insofar as they are within the scope of the appended claims of the equivalents thereof.

What is claimed is:

1. A signal switching apparatus, comprising:
    a switch circuit configured to have a common terminal and first to third terminals, and to enable two terminals among the first to third terminals to be simultaneously connected to the common terminal while enabling the first to third terminals to be individually attachable and detachable to and from the common terminal; and
    an amplification circuit having an input terminal connected to the first terminal, and an output terminal connected to the second terminal,
    wherein gain in the output terminal of the amplification circuit being an output point, with respect to a signal level in the common terminal being an input point, is switched to a first gain when only the first terminal is connected to the common terminal, a second gain when only the second terminal is connected to the common terminal, and a third gain when the first terminal and the second terminal are simultaneously connected to the common terminal, and
    wherein, when a signal level of an input signal input to the common terminal is smaller than a threshold value, only the first terminal is connected to the common terminal, when the signal level of the input terminal exceeds a second threshold value larger than the first threshold value, only the second terminal is connected to the common terminal, and when the signal level of the input signal is a value between the first threshold value and the second threshold value, the first terminal and the second terminal are simultaneously connected to the common terminal.

2. A signal switching apparatus, comprising:
    a switch circuit configured to have a common terminal and first to third terminals, and to enable two terminals among the first to third terminals to be simultaneously connected to the common terminal while enabling the first to third terminals to be individually attachable and detachable to and from the common terminal; and
    an amplification circuit having an input terminal connected to the first terminal and an output terminal connected to the second terminal,
    wherein gain in the output terminal of the amplification circuit being an output point, with respect to a signal level in the common terminal being an input point, is switched to a first gain when only the first terminal is connected to the common terminal a second gain when only the second terminal is connected to the common terminal, and a third gain when the first terminal and the second terminal are simultaneously connected to the common terminal, and
    wherein, when a signal level of an input signal input to the common terminal is smaller than a first threshold value, only the first terminal is connected to the common terminal, and when the signal level of the input signal exceeds the first threshold value, the first terminal and the second terminal are simultaneously connected to the common terminal, and after the first terminal and the second terminal are simultaneously connected to the common terminal then only the second terminal is connected to the common terminal.

3. The signal switching apparatus according to claim 1, further comprising:
    a control unit configured to control switching of a terminal being a connection destination of the common terminal;
    an antenna device configured to be connected to the common terminal;
    a transmission circuit configured to be connected to the third terminal; and
    a reception circuit configured to be connected to the output terminal of the amplification circuit.

4. The signal switching apparatus according to claim 2, further comprising:
- a control unit configured to control switching of a terminal being a connection destination of the common terminal;
- an antenna device configured to be connected to the common terminal;
- a transmission circuit configured to be connected to the third terminal; and
- a reception circuit configured to be connected to the output terminal of the amplification circuit.

* * * * *